US010510400B2

(12) United States Patent
Sano et al.

(10) Patent No.: US 10,510,400 B2
(45) Date of Patent: *Dec. 17, 2019

(54) SEMICONDUCTOR STORAGE DEVICE

(71) Applicant: Renesas Electronics Corporation, Tokyo (JP)

(72) Inventors: Toshiaki Sano, Kanagawa (JP); Ken Shibata, Kanagawa (JP); Shinji Tanaka, Tokyo (JP); Makoto Yabuuchi, Tokyo (JP); Noriaki Maeda, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/957,263

(22) Filed: Apr. 19, 2018

(65) Prior Publication Data

US 2018/0240513 A1 Aug. 23, 2018

Related U.S. Application Data

(63) Continuation of application No. 15/373,783, filed on Dec. 9, 2016, now Pat. No. 9,978,445, which is a (Continued)

(30) Foreign Application Priority Data

Mar. 25, 2014 (JP) .................... 2014-061812

(51) Int. Cl.
*G11C 7/00* (2006.01)
*G11C 11/419* (2006.01)
(Continued)

(52) U.S. Cl.
CPC .............. *G11C 11/419* (2013.01); *G11C 7/12* (2013.01); *G11C 11/418* (2013.01); *G11C 8/16* (2013.01); *G11C 11/412* (2013.01)

(58) Field of Classification Search
CPC ........... G11C 11/419; G11C 7/12; G11C 8/16; G11C 11/412; G11C 5/147; G11C 11/4074
(Continued)

(56) References Cited

U.S. PATENT DOCUMENTS 6,091,629 A 7/2000 Osada et al.
6,671,201 B2 12/2003 Masuda
(Continued)

FOREIGN PATENT DOCUMENTS

JP 08-212776 A 8/1996
JP 10-106269 A 4/1998
(Continued)

OTHER PUBLICATIONS

Chang, J., et al., "A 20nm 112Mb SRAM Design in High K/Metal Gate Technology with Assist Circuitry for Low Leakage and Low Vmin Applications," ISSCC, pp. 316-317, 2013.
(Continued)

*Primary Examiner* — Son T Dinh
(74) *Attorney, Agent, or Firm* — Shapiro, Gabor and Rosenberger, PLLC

(57) ABSTRACT

A semiconductor storage device provided can increase a write margin and suppress increase of a chip area. The semiconductor storage device includes plural memory cells arranged in a matrix; plural bit-line pairs arranged corresponding to each column of the memory cells; a write driver circuit which transmits data to a bit-line pair of a selected column according to write data; and a write assist circuit which drives a bit line on a low potential side of the bit-line pair of a selected column to a negative voltage level. The write assist circuit includes first signal wiring; a first driver circuit which drives the first signal wiring according to a control signal; and second signal wiring which is coupled to
(Continued)

the bit line on the low-potential side and generates a negative voltage by the driving of the first driver circuit, based on inter-wire coupling capacitance with the first signal wiring.

12 Claims, 13 Drawing Sheets

Related U.S. Application Data continuation of application No. 15/134,981, filed on Apr. 21, 2016, now Pat. No. 9,548,106, which is a continuation of application No. 14/658,163, filed on Mar. 14, 2015, now Pat. No. 9,349,438.

(51) Int. Cl.
   *G11C 7/12* (2006.01)
   *G11C 11/418* (2006.01)
   *G11C 8/16* (2006.01)
   *G11C 11/412* (2006.01)

(58) Field of Classification Search
   USPC ........................................ 365/189.14, 189.16
   See application file for complete search history.

(56) References Cited

U.S. PATENT DOCUMENTS

| | | | |
|---|---|---|---|
| 8,233,342 B2 | 7/2012 | Adams et al. | |
| 8,582,389 B2 | 11/2013 | Gajjewar et al. | |
| 9,349,438 B2 * | 5/2016 | Sano | G11C 7/12 |
| 9,978,445 B2 * | 5/2018 | Sano | G11C 7/12 |
| 2006/0262628 A1 | 11/2006 | Nii et al. | |
| 2009/0109768 A1 | 4/2009 | Lee et al. | |
| 2010/0188909 A1 | 7/2010 | Kenkare et al. | |
| 2012/0170388 A1 | 7/2012 | Choi | |
| 2013/0176796 A1 | 7/2013 | Tanabe | |

FOREIGN PATENT DOCUMENTS

| | | |
|---|---|---|
| JP | 2002-298586 A | 10/2002 |
| JP | 2009-295246 A | 12/2009 |
| JP | 2013-025848 A | 2/2013 |
| TW | 201306031 A | 2/2013 |

OTHER PUBLICATIONS

Wang, D.P., et al., "A 45nm Dual-Port SRAM with Write and Read Capability Enhancement at Low Voltage," SOC Conference, IEEE International, pp. 211-214, 2007.
Extended European Search Report (including supplementary European search report and search opinion) from European Patent Application No. 15157620.4, dated Sep. 30, 2015.
Extended European Search Report dated Jun. 13, 2017, in European Application No. 17152697.3.
Office Action dated Jun. 13, 2017, in Japanese Patent Application No. 2014-061812.
Office Action dated Sep. 28, 2018, in Taiwanese Application No. 104109116.

* cited by examiner

SEMICONDUCTOR STORAGE DEVICE

CROSS-REFERENCE TO RELATED APPLICATIONS

The disclosure of Japanese Patent Application No. 2014-061812 filed on Mar. 25, 2014 including the specification, drawings and abstract is incorporated herein by reference in its entirety.

BACKGROUND

The present invention relates to a semiconductor storage device, especially to an SRAM (Static Random Access Memory).

Miniaturization of a transistor element is advanced with the aim of attaining a high level of integration. Accompanying with the miniaturization, manufacturing variations become large, causing significant variations in the property of the transistor element. Accompanying with the miniaturization, there is also advancement in securing reliability and lowering voltages to reduce power consumption. For this reason, there arises an issue that the write margin of an SRAM is decreased.

To this issue, a method is proposed for preventing the malfunctioning of a write operation, by setting a bit line to a negative voltage at the time of writing in order to improve the current driving capacity of an access MOS transistor of a memory cell (Patent Documents 1 and 2, Non-patent Documents 1 and 2).

Patent Document 1 discloses a method in which a boost circuit comprised of a boost capacitor and an inverter to drive it is provided in each of a bit-line pair, and the boost circuit on the side of a bit line set at a ground voltage is selected and driven.

Patent Document 2 discloses a method in which a boost circuit comprised of a boost capacitor and an inverter to drive it is coupled to each of a bit-line pair via a switch and a negative voltage is transferred by selecting a switch on the side of a bit line driven to the ground potential.

Non-patent Document 1 discloses the following method: An inverter is provided to each of bit-line pairs as a write driver circuit. Sources of two write inverters are short-circuited and coupled to a low-voltage side power source VSS via a power switch. A boost capacitor is coupled to the short-circuited sources of the write inverters. When the power switch is turned OFF, only an output node of the inverter on the side of outputting the ground voltage is floated. Then the boosted negative voltage is transmitted to a bit line via an NMOS of a write inverter which outputs the ground voltage and a Y switch.

Non-patent Document 2 discloses, with regard to a dual port SRAM, a method in which a bit line is driven to a ground voltage according to write data, then floated, and subsequently boosted to a negative voltage via a boost capacitor.

PATENT DOCUMENT (Patent Document 1) Japanese Patent Laid-open No. 2002-298586
(Patent Document 2) Japanese Patent Laid-open No. 2009-295246

NON-PATENT DOCUMENT (Non-patent Document 1) J. Chang, et al; "A 20 nm 112 Mb SRAM Design in High K/Metal Gate Technology with Assist Circuitry for Low Leakage and Low Vmin Applications," ISSCC'13

(Non-patent Document 2) D. P. Wang, et al; "A 45 nm Dual-Port SRAM with Write and Read Capability Enhancement at Low Voltage", SOC Conference, 2007 IEEE International

SUMMARY

On the other hand, when there is an IP with different bit line length like a compiled memory, bit line capacitance varies with the length of a bit line. Accordingly, it is necessary to form the boost capacitor corresponding to the bit line length individually; therefore, there arises a possibility of increase of a chip area.

In order to solve the issues described above, a semiconductor storage device which can increase a write margin and suppress the increase of a chip area is provided.

The other issues and new features of the present invention will become clear from the description of the present specification and the accompanying drawings.

According to one embodiment, a semiconductor storage device is comprised of plural memory cells arranged in a matrix; plural bit-line pairs arranged corresponding to each column of the memory cells; a write driver circuit to transmit data to a bit-line pair of a selected column according to write data; and a write assist circuit to drive a bit line on a low potential side of a bit-line pair of the selected column to a negative voltage level. The write assist circuit is comprised of first signal wiring; a first driver circuit to drive the first signal wiring according to a control signal; and second signal wiring coupled to the bit line on the low potential side and to generate a negative voltage by the driving of the first driver circuit, based on inter-wire coupling capacitance with the first signal wiring.

According to one embodiment, it is possible to increase a write margin and to suppress increase of a chip area by the above-described configuration.

DETAILED DESCRIPTION

Figure 1:
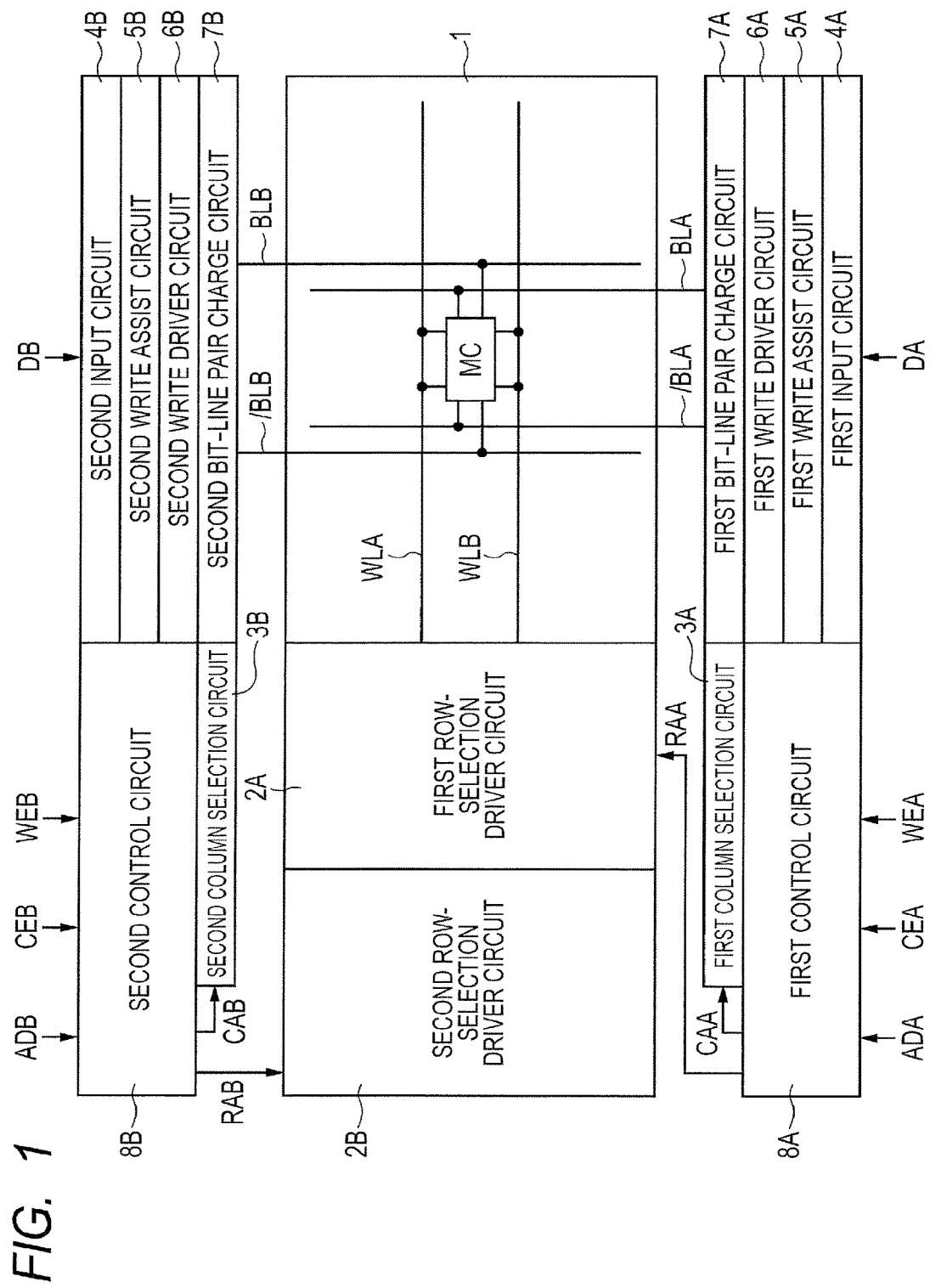
FIG. 1 is an explanatory drawing of the outline of an entire configuration of a semiconductor storage device according to Embodiment 1.

The embodiments of the present invention will be explained in detail, with reference to the accompanying drawings. In the following, the same symbol or reference numeral is attached to the same or corresponding element and the repeated explanation thereof will be omitted.

Embodiment 1

<The Entire Configuration of a Semiconductor Storage Device>

FIG. 1 is an explanatory drawing of the outline of an entire configuration of a semiconductor storage device according to Embodiment 1.

As illustrated in FIG. 1, the semiconductor storage device is comprised of a memory cell array 1 having plural memory cells MC arranged in a matrix. The memory cell array 1 is comprised of plural word lines provided corresponding to each row of the memory cells, and plural bit-line pairs provided corresponding to each column of the memory cells. Here, the memory cell MC is the so-called dual port cell which is comprised of a first word line WLA and a corresponding first bit-line pair BLA and /BLA, and a second word line WLB and a corresponding second bit-line pair BLB and /BLB.

The semiconductor storage device is comprised of a first row-selection driver circuit 2A which chooses the first word line WLA, and a first column selection circuit 3A which generates a column selection signal for choosing a first column of the memory cell array 1. The semiconductor storage device is further comprised of a first input circuit 4A which inputs first write data DA, and a first write driver circuit 6A which transfers the first write data DA transferred from the first input circuit 4A to the first bit-line pair BLA and /BLA selected by the first column selection circuit 3A. The semiconductor storage device is further comprised of a first write assist circuit 5A, a first bit-line pair charge circuit 7A which charges the first bit-line pair BLA and /BLA, and a first control circuit 8A.

The semiconductor storage device is comprised of a second row-selection driver circuit 2B which chooses the second word line WLB, and a second column selection circuit 3B which generates a column selection signal for choosing a second column of the memory cell array 1. The semiconductor storage device is further comprised of a second input circuit 4B which inputs second write data DB, a second write driver circuit 6B which transfers the second write data DB transferred from the second input circuit 4B to the second bit-line pair BLB and /BLB selected by the second column selection circuit 3B, a second write assist circuit 5B, a second bit-line pair charge circuit 7B which charges the second bit-line pair BLB and /BLB, and a second control circuit 8B.

The first row-selection driver circuit 2A drives a first word line WLA to a selected state, the first word line WLA being corresponding to the first row specified by an internal row address RAA outputted from the first control circuit 8A.

The first column selection circuit 3A generates a column selection signal which specifies the first column of the memory cell array 1 according to an internal column address signal CAA outputted from the first control circuit 8A.

The first write data DA inputted into the first input circuit 4A is transferred to the first write driver circuit 6A as a pair of complementary data.

The first write driver circuit 6A transfers data to the first bit-line pair BLA and /BLA by the first column selection circuit 3A according to a pair of data, and the data is written in a memory cell MC coupled to the first word line WLA selected by the first row-selection driver circuit 2A.

After the completion of the data writing to the memory cell MC, the first bit-line pair charge circuit 7A charges the first bit-line pair BLA and /BLA at a predetermined voltage level.

The operations of the second row-selection driver circuit 2B, the second column selection circuit 3B, the second input circuit 4B, the second write driver circuit 6B, the second write assist circuit 5B, the second bit-line pair charge circuit 7B, and the second control circuit 8B, to the second word line WLB and the second bit-line pair BLB and /BLB are similar to what has been explained above; therefore, the detailed explanation thereof is omitted.

<A Configuration of the Memory Cell MC>

Figure 2:
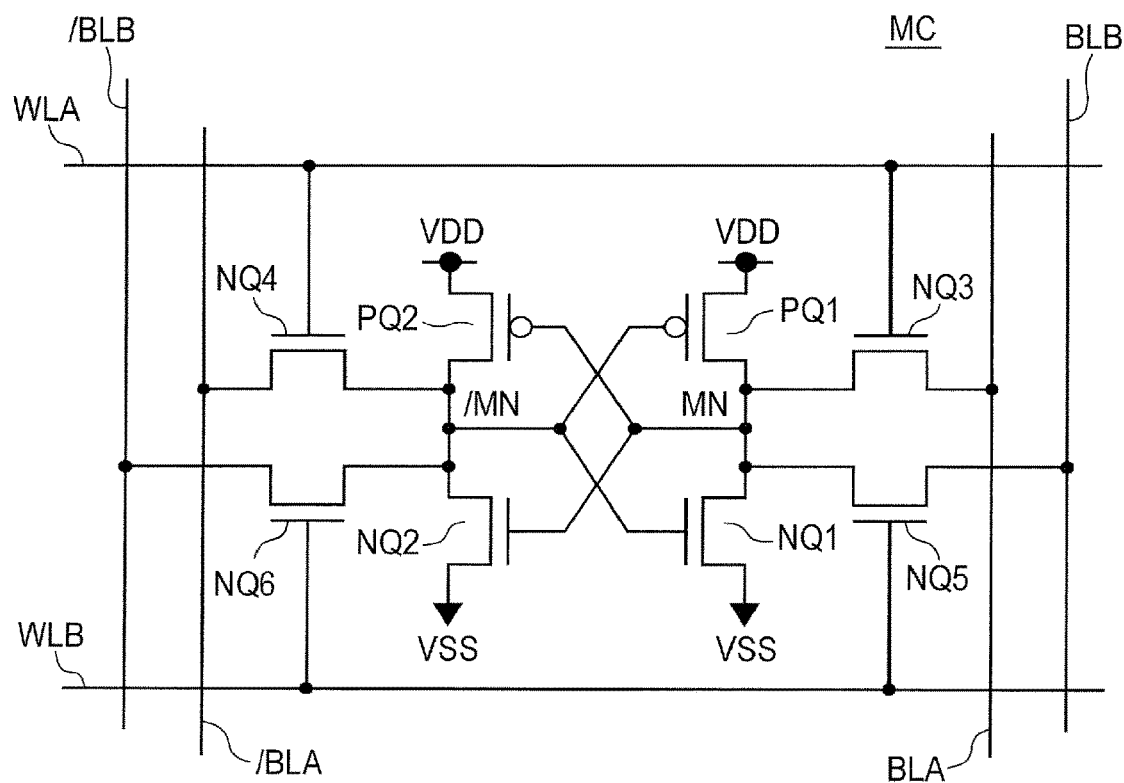
FIG. 2 is an explanatory drawing of a configuration of a memory cell MC.

FIG. 2 is an explanatory drawing of a configuration of the memory cell MC.

As illustrated in FIG. 2, the memory cell MC is comprised of a first and a second CMOS inverter. The first CMOS inverter is comprised of a load P-channel MOS (field effect type) transistor PQ1 and a driver N-channel MOS transistor NQ1, coupled between a voltage VDD and a voltage VSS. The second CMOS inverter is comprised of a load P-channel MOS transistor PQ2 and a driver N-channel MOS transistor NQ2, coupled between the voltage VDD and the voltage VSS. The voltage VSS is lower than the voltage VDD.

An output node of the first CMOS inverter is coupled to an input node of the second COS inverter and an output node of the second CMOS inverter is coupled to an input node of the first CMOS inverter. Accordingly, the so-called inverter latch is configured. Therefore, complementary data is held at memory nodes MN and /MN which are the output nodes of the inverter latch.

The Memory cell MC is comprised of N-channel access MOS transistors NQ3 and NQ4 which conduct respectively the memory nodes MN and /MN with the first bit-line pair BLA and /BLA, and N-channel access MOS transistors NQ5 and NQ6 which conduct respectively the memory nodes MN and /MN with the second bit-line pair BLB and /BLB.

Gates of the access MOS transistors NQ3 and NQ4 are coupled to the first word line WLA, and gates of the access MOS transistors NQ5 and NQ6 are coupled to the second word line WLB. They operate alternatively.

The memory cell MC is an eight-transistor dual-port SRAM cell. The usual write operation of the dual-port SRAM memory cell MC is now explained.

As an example, it is assumed that an "H" level potential and an "L" level potential are held at the memory nodes MN and /MN, respectively. The following explains the case where the potentials of the memory nodes MN and /MN are reversed using the first word line WLA and the first bit-line pair BLA and /BLA.

It is assumed that the second word line WLB is not selected (at an "L" level). Here, an "L" level potential and an "H" level potential are given to the first bit-line pair BLA and /BLA, respectively.

Next, the first word line WLA is set at an "H" level. Accordingly, the "L" level potential of the first bit-line pair BLA is transferred to the memory node MN through the access MOS transistor NQ3. Then reversed by the second CMOS inverter, the memory node /MN is set to an "H" level.

On the other hand, the dual-port SRAM memory cell MC concerned has the characteristic state which is called disturb writing. Specifically, it is the state where the second word line WLB becomes at an "H" level potential during the write operation described above.

The second bit-line pair BLB and /BLB is assumed to be in the state of a precharge level of an "H" level. This state occurs when read/write is performed to other memory cells which share the second word line WLB.

At this time, the access MOS transistors NQ3 and NQ5 both become conductive; accordingly, the memory node MN is not set at the ground potential completely.

When the threshold voltage of the access MOS transistor NQ5 becomes low, the potential of the memory node MN rises further. When the absolute value of the threshold voltage of the load MOS transistor PQ2 becomes large, the capability to pull up the potential of the memory node /MN becomes weakened, slowing down the write operation.

Therefore, in order to ensure a high speed writing even after the miniaturization and at the low power source voltage accompanying it, the first write assist circuit 5A and the second write assist circuit 5B are provided as illustrated in FIG. 1.

In the ordinary write operation and disturb writing described above, the explanation is made for the case where the writing is performed with the use of the first word line WLA and the first bit-line pair BLA and /BLA as an example. However, same applies to the case where the second word line WLB and the second bit-line pair BLB and /BLB are used.

Same also applies to the case where the memory node /MN is drawn out from an "H" level to an "L" level.

The following explanation is made for the operation which reverses the memory node MN of the memory cell MC from an "H" level to an "L" level as an example, with the use of the first word line WLA, the first bit-line pair BLA and /BLA, the first input circuit 4A, the first write assist circuit 5A, the first write driver circuit 6A, and the first bit-line pair charge circuit 7A. However, same applies to the case where the second word line WLB, the second bit-line pair BLB and /BLB, the second input circuit 4B, the second write assist circuit 5B, the second write driver circuit 6B, and the second bit-line pair charge circuit 7B are used. Same also applies to the case where the memory node /MN of the memory cell MC is reversed from an "H" level to an "L" level.

<Configurations of Other Peripheral Circuits>

Figure 3:
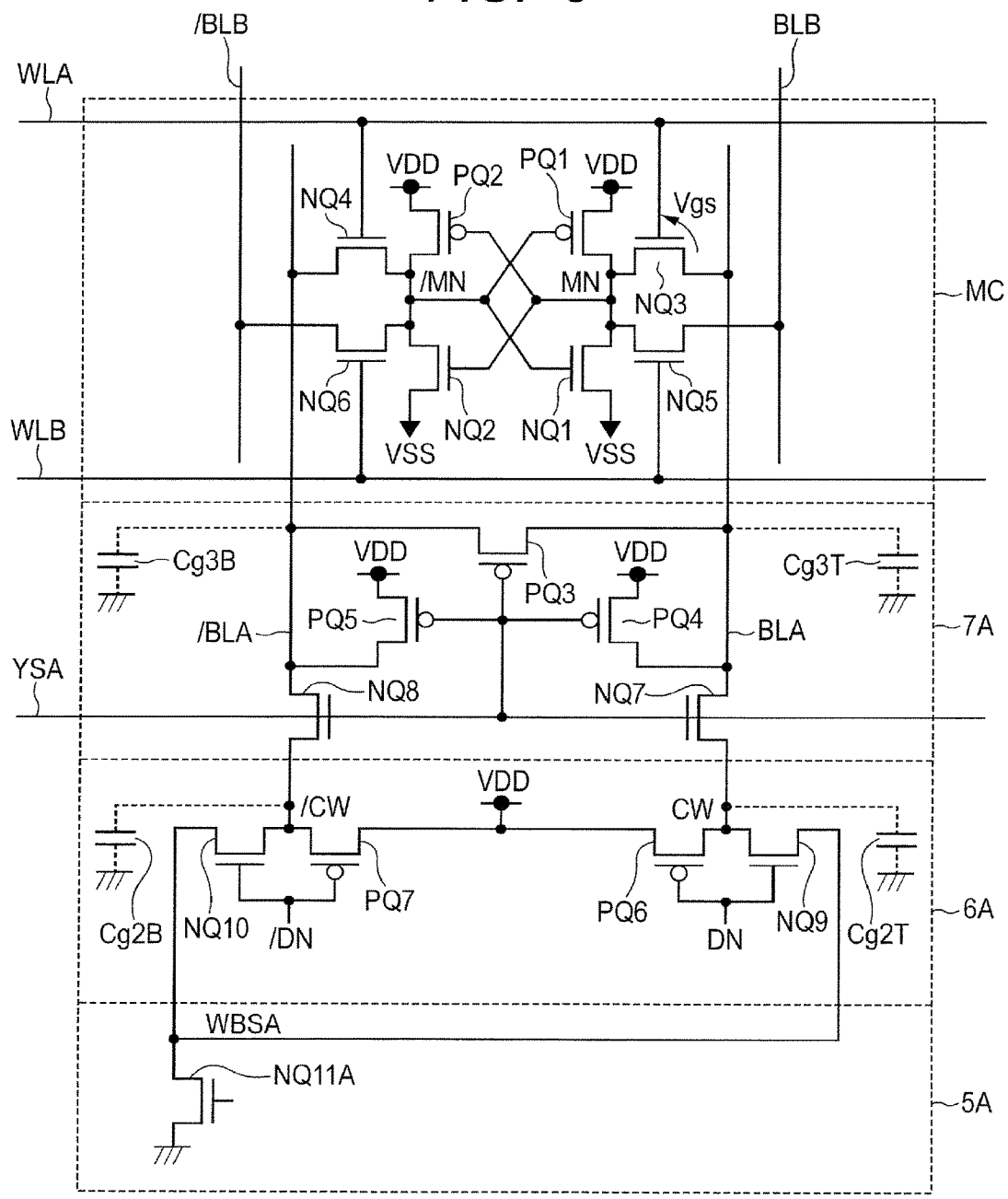
FIG. 3 is an explanatory drawing of configurations of a first write driver circuit 6A and a first bit-line pair charge circuit 7A according to Embodiment 1.

FIG. 3 is an explanatory drawing of configurations of the first write driver circuit 6A and the first bit-line pair charge circuit 7A according to Embodiment 1.

FIG. 3 illustrates partially the memory cell MC, the first bit-line pair charge circuit 7A, the first write driver circuit 6A, and the first write assist circuit 5A.

The first bit-line pair charge circuit 7A is comprised of a P-channel equalizing MOS transistor PQ3 which short-circuits the first bit-line pair BLA and /BLA and P-channel MOS transistors PQ4 and PQ5 which pull up the first bit-line pair BLA and /BLA to the voltage VDD. The first bit-line pair charge circuit 7A is further comprised of N-channel transfer MOS transistors NQ7 and NQ8 which couple the first bit-line pair BLA and /BLA to output nodes CW and /CW of the first write driver circuit 6A, respectively.

Note that the parasitic capacitance (grounding capacitance) parasitically existing in the first bit-line pair BLA and /BLA is illustrated in FIG. 3 as Cg3T and Cg3B.

A gate of the equalizing MOS transistor PQ3, gates of the pull-up MOS transistors PQ4 and PQ5, and gates of the transfer MOS transistors NQ7 and NQ8 are coupled to a first column selection signal YSA.

The first write driver circuit 6A is comprised of a first write inverter comprised of a P-channel MOS transistor PQ6 and an N-channel MOS transistor NQ9, and a second write inverter comprised of a P-channel MOS transistor PQ7 and an N-channel MOS transistor NQ10.

A source node WBSA of the first and the second write inverter is short-circuited and coupled to the first write assist circuit 5A.

Note that the parasitic capacitance (grounding capacitance) parasitically existing in the output nodes CW and /CW of the first and the second write inverter is illustrated in FIG. 3 as Cg2T and Cg2B.

The first write assist circuit 5A is comprised of an N-channel MOS transistor NQ11A coupled between the source node WBSA and the voltage VSS. The details of the first write assist circuit 5A will be described later.

The configurations of the second bit-line pair charge circuit 7B and the second write driver circuit 6B are the same as the configurations of the first bit-line pair charge circuit 7A and the first write driver circuit 6A. Accordingly, the detailed explanation thereof will not be repeated.

Figure 4:
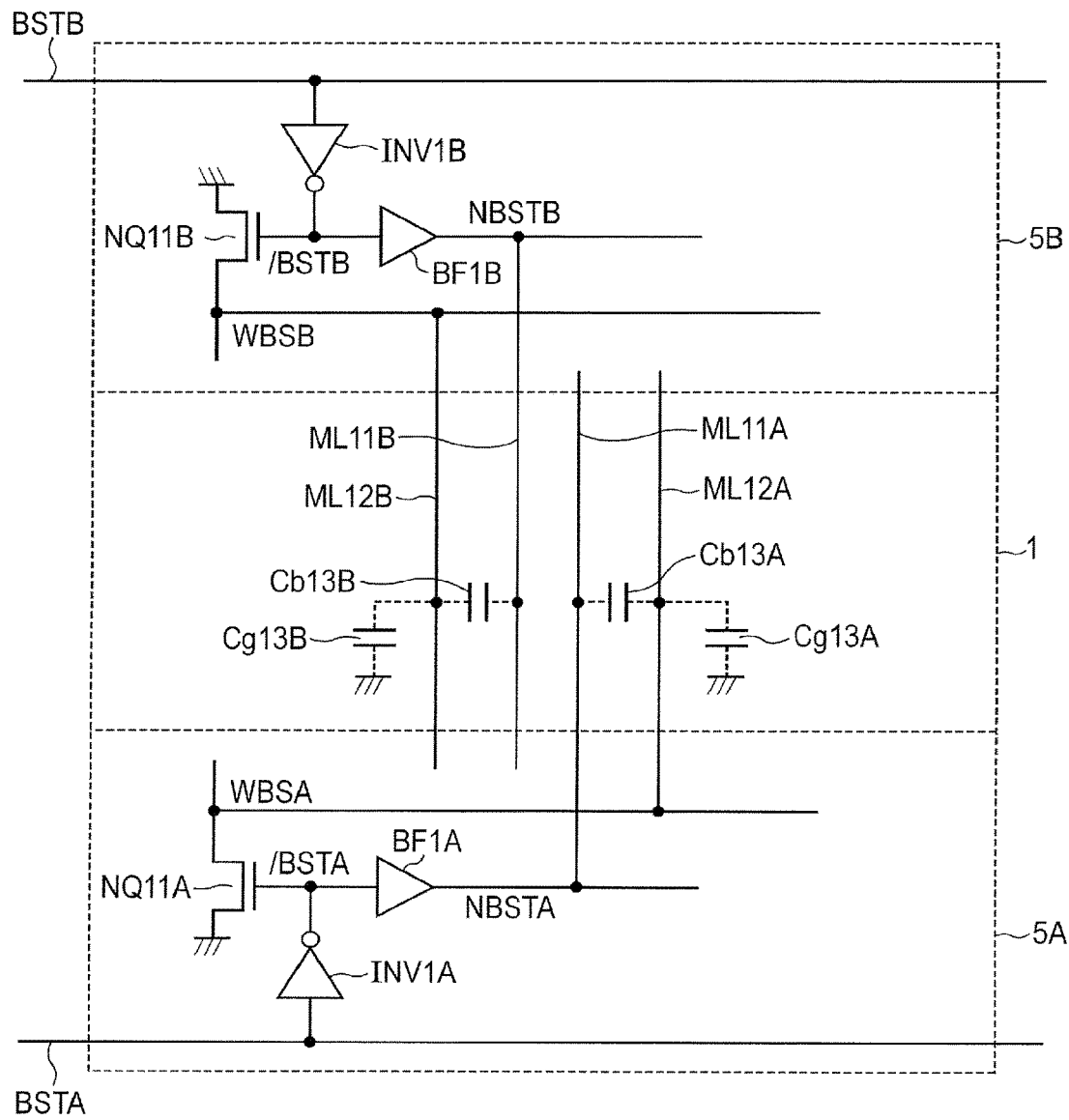
FIG. 4 is an explanatory drawing of configurations of a first write assist circuit 5A and a second write assist circuit 5B according to Embodiment 1.

Next, the configuration of the first write assist circuit 5A is explained. FIG. 4 is an explanatory drawing of configurations of the first write assist circuit 5A and the second write assist circuit 5B according to Embodiment 1.

As illustrated in FIG. 4, the first write assist circuit 5A is comprised of an N-channel MOS transistor NQ11A which couples the source node WBSA of the first and the second write inverter to the voltage VSS, an inverter INV1A, a buffer BUF1A, first signal wiring ML11A, and second signal wiring ML12A. In the present embodiment, the first write assist circuit 5A described above is provided corresponding to each column of the memory cells.

In the present embodiment, a boost capacitive element Cb13A of the first write assist circuit 5A is formed based on the inter-wire coupling capacitance between the first signal wiring ML11A and the second signal wiring ML12A.

A grounding capacitive element Cg13A is formed based on the inter-wire coupling capacitance between the second signal wiring ML12A and the power supply line of the voltage VSS.

A first boost signal BSTA is inputted to the first inverter INV1A. The first boost signal BSTA concerned is outputted from the first control circuit 8A.

An output node /BSTA of the first inverter INV1A is coupled to a gate of the N-channel MOS transistor NQ11A.

The output node /BSTA is coupled to an input of the buffer BF1A, and the buffer BF1A drives the first signal wiring ML11A coupled to an output node NBSTA of the buffer BF1A according to the output node /BSTA.

Figure 5:
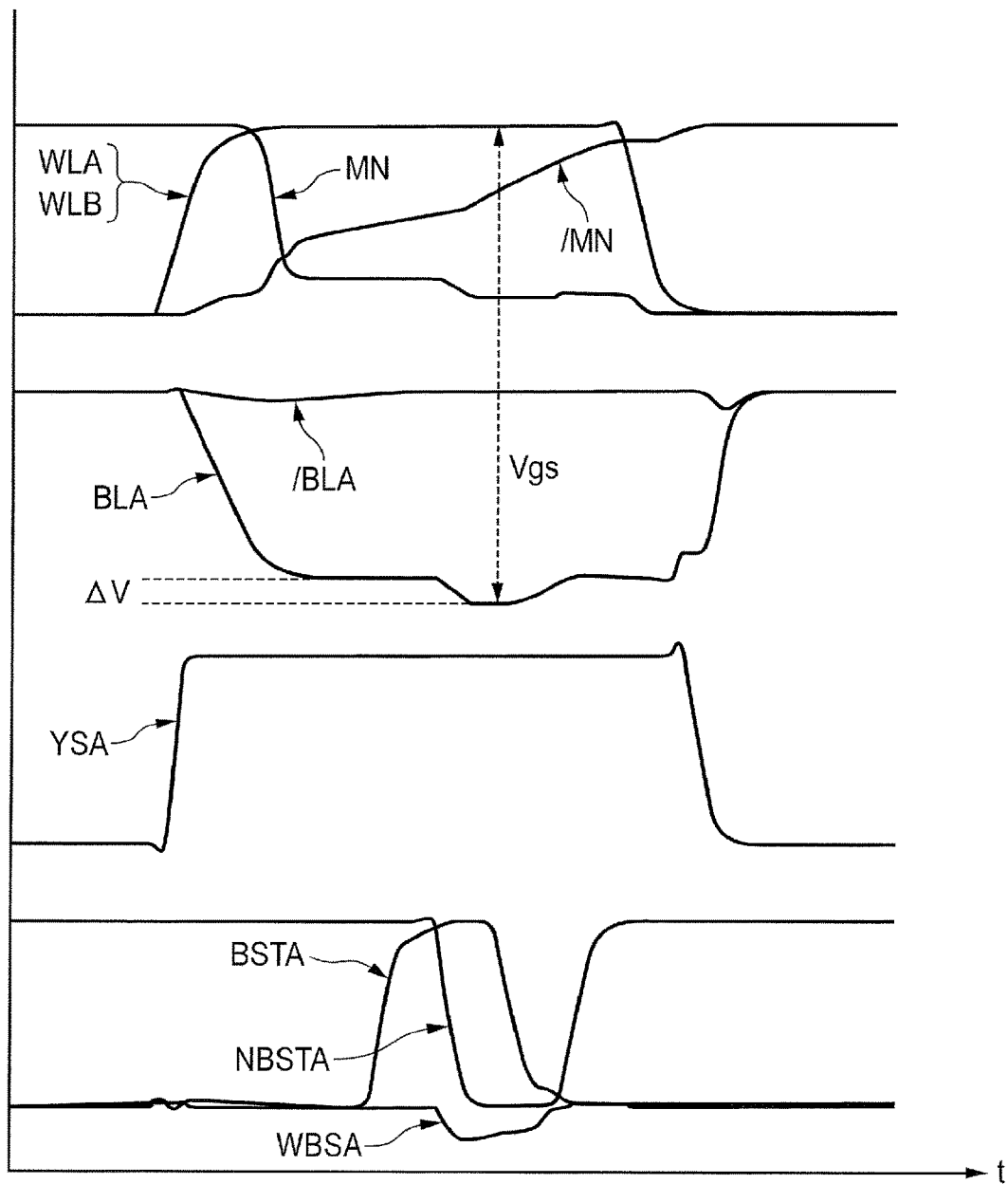
FIG. 5 is an explanatory drawing of signal waveforms in a write operation according to Embodiment 1.

FIG. 5 is an explanatory drawing of signal waveforms in a write operation according to Embodiment 1. As illustrated in FIG. 5, the following explains the case where the memory node MN is reversed from an "H" level to an "L" level and the memory node /MN is reversed from an "L" level to an "H" level, using the first word line WLA and the first bit-line pair BLA and /BLA.

It is assumed that the second bit-line pair BLB and /BLB is in a precharged state. The waveforms when the second word line WLB operates to the same timing as the first word line WLA are shown as an example.

As an initial state, the first and the second word lines WLA and WLB are at an "L" level, the first column selection signal YSA is also at an "L" level, and the first bit-line pair BLA and /BLA is precharged at an "H" level by the equalizing MOS transistor PQ3 and the precharge MOS transistors PQ4 and PQ5. On the other hand, the transfer MOS transistors NQ7 and NQ8 are in a non-conductive state.

Next, an "L" level is inputted into the first write data DA. According to the first write data DA, complementary first write input data DN and /DN are inputted into the first write driver circuit 6A by the first input circuit 4A. Then the reversed output appears at the output nodes CW and /CW of the first and the second write inverter. Here, it is assumed that the first write input data DN and /DN are at an "H" level and an "L" level respectively as an example; then the output nodes CW and /CW become at an "L" level and an "H" level respectively.

Next, the first column selection signal YSA is set to an "H" level, and the equalizing MOS transistor PQ3 and the pull-up MOS transistors PQ4 and PQ5 become non-conductive. Then the transfer MOS transistors NQ7 and NQ8 become in a conductive state, the potential of the output nodes CW and /CW of the first and the second write inverter is transferred to the first bit-line pair BLA and /BLA, and the first bit line BLA is drawn out to an "L" level.

Next, the first and the second word line WLA and WLB are set to an "H" level, the potential of the first bit line BLA is transferred to the memory node MN, and the potential of the memory node MN falls.

On the other hand, the second word line WLB is also at an "H" level. Accordingly, a precharge current flows from the second bit line BLB, and the memory node MN is not set at the ground potential completely.

Therefore, the load MOS transistor PQ2 does not become in a fully conductive state, and the speed at which the memory node /MN goes up to an "H" level is reduced.

When the first boost signal BSTA is set at an "H" level, the output node /BSTA coupled to the gate of the N-channel power source MOS transistor NQ11A is set at an "L" level by the inverter INV1A. Accordingly, the N-channel power source MOS transistor NQ11A becomes non-conductive and the source node WBSA of the write inverter becomes floated.

Next, the output node NBSTA of the buffer BF1A is set at an "L" level. Accordingly, the source node WBSA of the write inverter is boosted to the negative potential based on the boost capacitive element Cb13A.

The potential of the source node WBSA pulls down the potential of the first bit line BLA via the N-channel MOS transistor NQ9 and the transfer MOS transistor NQ7 of the first write inverter.

Then, the gate-to-source voltage Vgs of the access MOS transistor NQ3 becomes large, the current driving capacity of the access MOS transistor NQ3 increases, and the potential of the memory node MN is further pulled down.

When the load MOS transistor PQ2 becomes fully conductive, the memory node /MN is pulled up to an "H" level and the reversal of the memory node is accelerated.

Accordingly, even when the variations due to miniaturization become large and the supply voltage is low, a stable writing at a high speed can be performed.

However, the potential of the first bit line BLA rises due to current inflow from the second bit line BLB. When the potential of the first bit line BLA changes to a positive potential, the effect of the write assist is lost, and moreover the potential once reversed can be re-reversed.

Therefore, it is necessary that the boost signal BSTA is returned to an "L" level to make the power source MOS transistor NQ11A conductive and to return the source node WBSA of the write inverter to the ground potential, before the potential of the first bit line BLA changes to a positive potential.

Subsequently, by setting the first word line WLA at an "L" level, the state of the memory nodes MN and /MN is reversed and stabilized.

Subsequently, by setting the first column selection signal YSA at an "L" level, the first bit-line pair BLA and /BLA is precharged, and the write operation is terminated.

Figure 6:
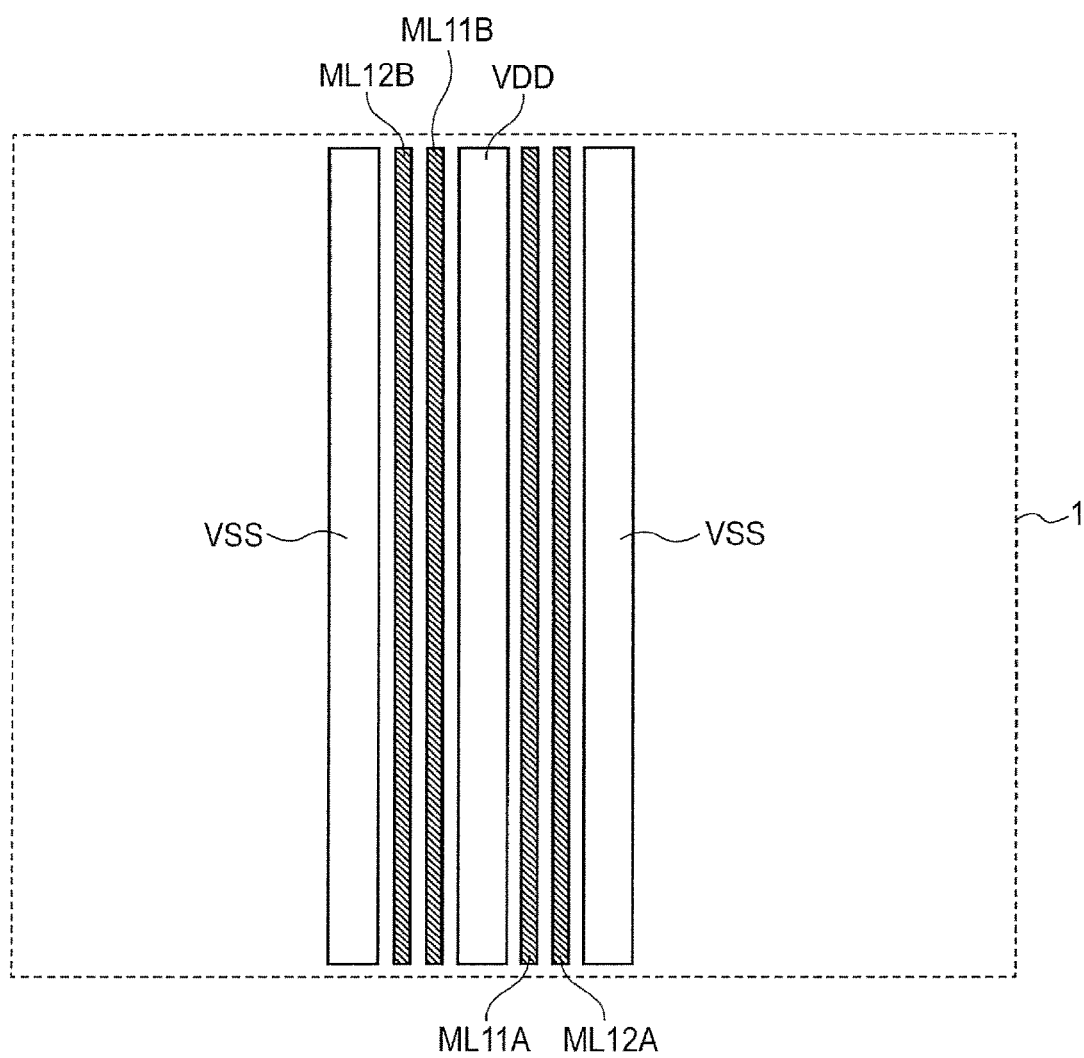
FIG. 6 is an explanatory drawing of arrangement of the signal wiring according to Embodiment 1.

FIG. 6 is an explanatory drawing of arrangement of the signal wiring according to Embodiment 1. As illustrated in FIG. 6, in the present embodiment, a metallic wiring layer is formed in an upper layer of the memory cell array 1.

Specifically, the signal wiring is arranged along the same row direction as the power supply wiring for supplying the voltage VDD and the power supply wiring for supplying the voltage VSS, both provided in the upper layer of the memory cell array 1. It is assumed that the signal wiring is formed employing the same metallic wiring layer as the power supply wiring for supplying the voltage VDD and VSS, as an example.

In the present embodiment, two pieces of signal wiring ML11A and ML12A are provided between the power supply wiring for supplying the voltage VDD and the power supply wiring for supplying the voltage VSS. Two pieces of signal wiring ML11B and ML12B are also provided in the same way.

As the configuration, the signal wiring is provided in the upper layer of the memory cell array 1, and by arranging the first and the second signal wiring, the boost capacitive element is provided based on the inter-wire coupling capacitance of the signal wiring, instead of providing a boost capacitive element on the substrate. Therefore, it is possible to reduce the chip area.

The above-described configuration has structure in which two pieces of signal wiring are sandwiched between two pieces of power supply wiring; however, the number of the signal wiring and the order of the signal wiring are arbitrary. It is also preferable that a grounding line is suitably arranged next to the signal wiring.

It is possible to adjust the value of capacitance of the boost capacitive element easily, by adjusting the length of the signal wiring.

Even if the bit line provided in the memory cell array 1 has a different length, it is possible to modify the boost capacitance easily according to the length of the bit line. According to the structure in which the signal wiring is arranged as described above, it is possible to form a suitable boost capacitance easily also to a memory IP of which the bit line length differs.

Figure 7:
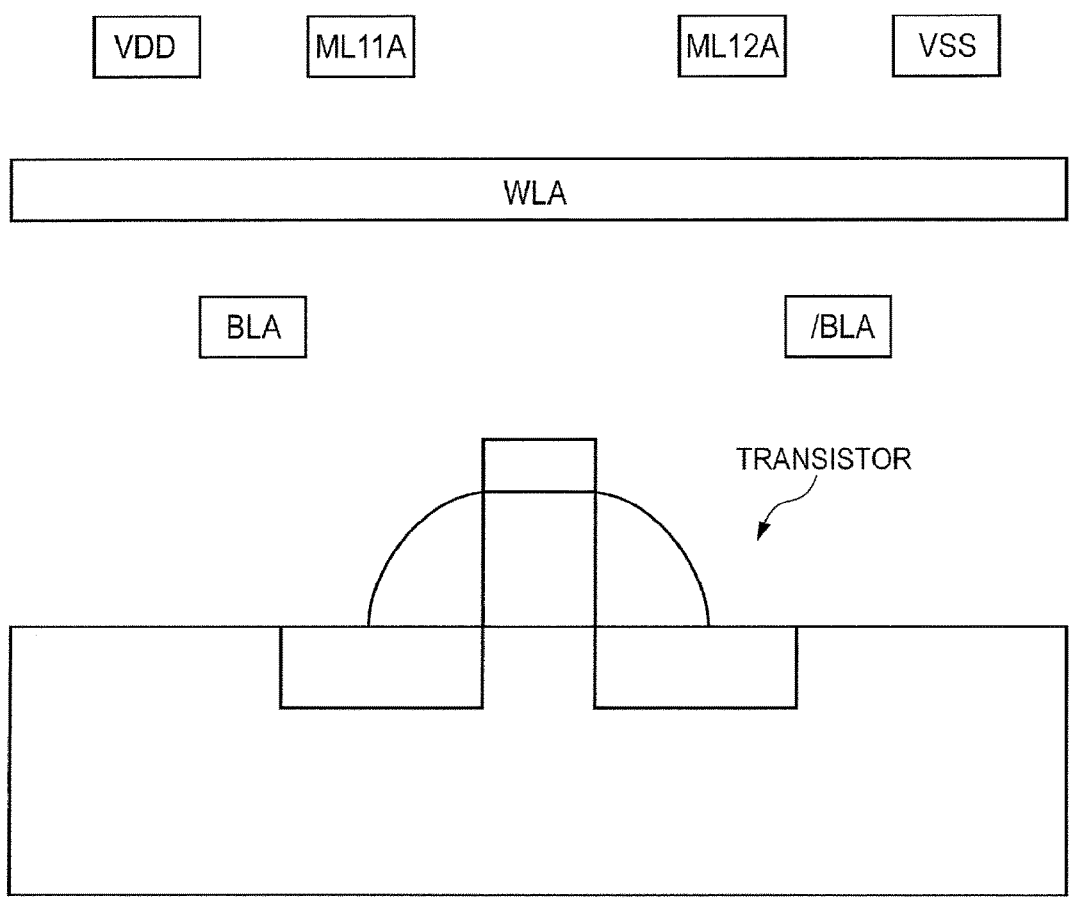
FIG. 7 is an explanatory drawing of the structure of the signal wiring according to Embodiment 1.

FIG. 7 is an explanatory drawing of the structure of the signal wiring according to Embodiment 1. As illustrated in FIG. 7, the MOS transistor is provided over a semiconductor substrate. In a metallic wiring layer of an upper layer thereof, the bit-line pair BLA and /BLA is provided. In a further upper layer, the word line WLA is provided. In a yet further upper layer, the power supply wiring of the voltage VDD and VSS is provided. The two pieces of signal wiring ML11A and ML12A are provided in the same metallic wiring layer.

The power supply wiring of the voltage VDD and VSS can also produce an effect of a shield which prevents the cross talk from the signal wiring of the layer. As for the effect of the shield, other wiring than the power supply wiring which supplies the voltage VDD and VSS is also effective, as long as the potential thereof is fixed at the time of a boost operation.

Figure 8:
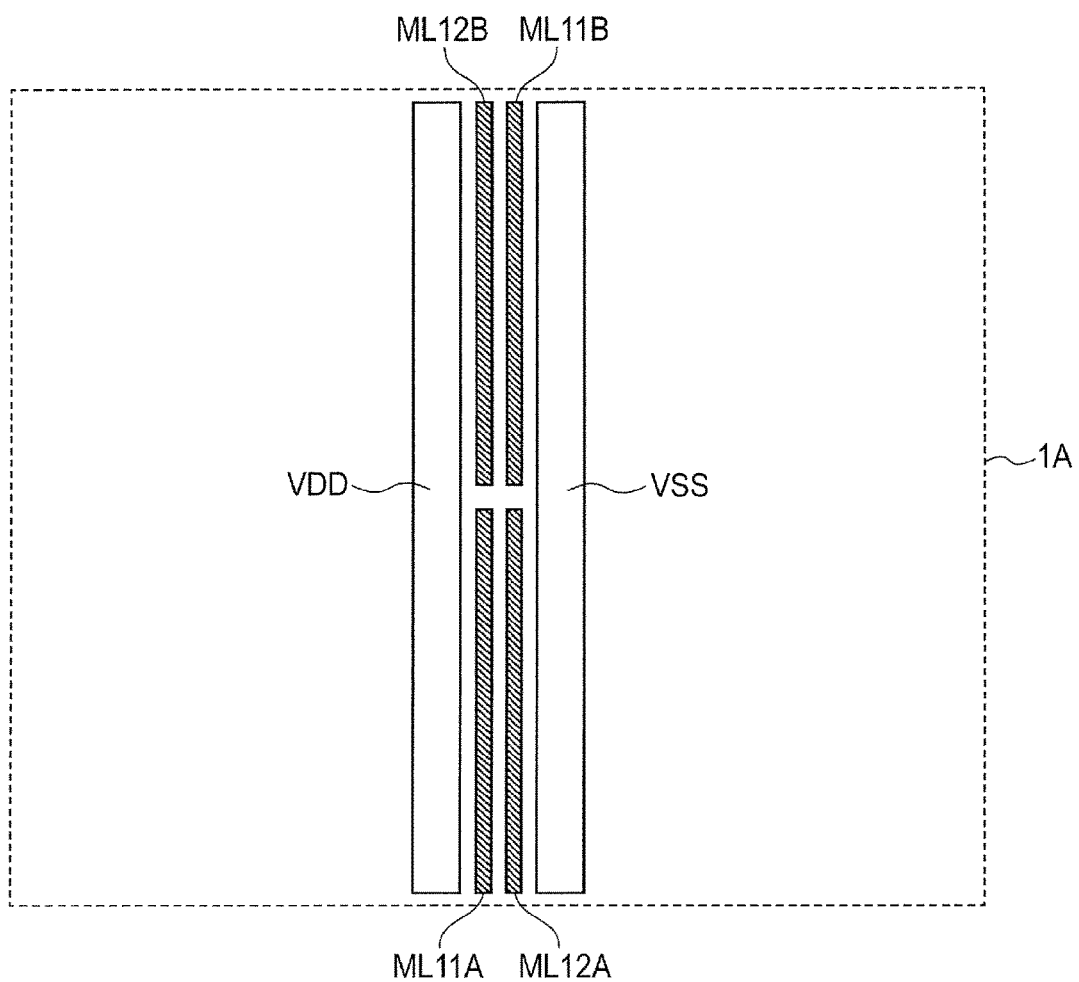
FIG. 8 is an explanatory drawing of another arrangement of the signal wiring according to Embodiment 1.

FIG. 8 is an explanatory drawing of another arrangement of the signal wiring according to Embodiment 1. Instead of arranging the signal wiring from the upper end to the lower end along in the row direction as in the memory cell array 1, it is possible to arrange the signal wiring in the half length of the row direction as in a memory cell array 1A as illustrated in FIG. 8.

Figure 9:
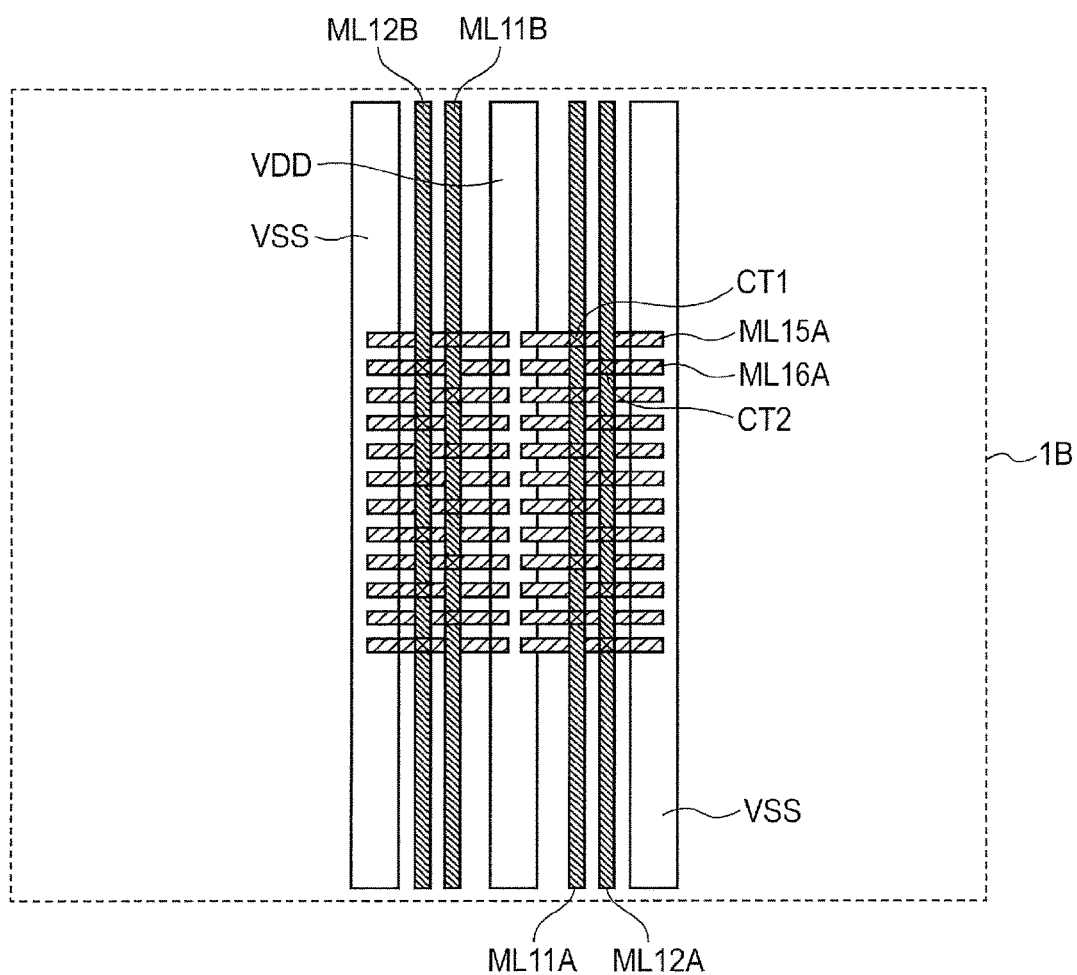
FIG. 9 is an explanatory drawing of further another arrangement of the signal wiring according to Embodiment 1.

FIG. 9 is an explanatory drawing of further another arrangement of the signal wiring according to Embodiment 1. As illustrated in FIG. 9, a memory cell array 1B is different from the other memory cell arrays in that signal wiring is further added to the first signal wiring ML11A and the second signal wiring ML12A.

Plural pieces of sub signal wiring ML15A are provided to the first signal wiring ML11A. Plural pieces of sub signal wiring ML16A are provided to the second signal wiring ML12A.

The first signal wiring ML11A is coupled to the plural pieces of sub signal wiring ML15A via a contact CT1.

The second signal wiring ML12A is coupled to the plural pieces of sub signal wiring ML16A via a contact CT2.

The sub signal wiring ML15A and the sub signal wiring ML16A are arranged along the column direction to the direction which intersects the power source line. The plural pieces of sub signal wiring can be formed using an upper metallic wiring layer or a lower metallic wiring layer of the first signal wiring ML11A and the second signal wiring ML12A. The adoption of the configuration described above allows easy adjustment of the boost capacitance of the boost capacitive element.

Modified Example

In the above, the case where the boost capacitive element is formed by the signal wiring is explained.

In Modified Example, adjustment of a potential change ΔV by the boost capacitive element is explained. The amount of voltage drop (potential change ΔV) of the bit line at the time of the boost of a negative voltage is decided by the ratio of boost capacitance and grounding capacitance.

$$\Delta V = -CB/(CB+CG) \times VDD \quad \text{(Equation 1)}$$

Here, $CG = Cg13A + Cg2T + Cg3T$, and $CB = Cb13A$.

CG is the sum of the parasitic capacitance Cg13A parasitically existing in the signal wiring ML12A, the parasitic capacitance Cg2T parasitically existing in the output node CW of the first write inverter, and the parasitic capacitance Cg3T parasitically existing in the first bit line BLA.

However, the influence of channel resistance, diffusion layer capacitance, and gate capacitance of the N-channel MOS transistors NQ9, NQ7, and NQ5 is not taken into consideration for simplification of explanation.

The total capacitance, expressed as Call, is defined by the following equation.

$$Call = CB + CG \quad \text{(Equation 2)}$$

In the dual-port SRAM, current flows in from a bit line of the port in a half-selected state (a word line is selected, a bit line is not selected and in a precharged state), and the negative voltage at the time of the boost rises. Accordingly, enhancement of the current driving capacity of the access MOS transistor is impeded. This effect becomes remarkable, when the bit line is short and the bit line capacitance is small.

When the boost capacitance is enlarged and the amount of voltage drop (potential change ΔV) of the bit line is enlarged, the access MOS transistor of a memory cell which shares the bit line concerned and is coupled to a different word line also becomes conducted, and it is possible that the data of the non-selection memory cell is reversed. That is, there is a possibility that an erroneous writing takes place. Therefore, it is necessary to keep the potential change ΔV in a certain fixed range.

On the other hand, in a half-selected state (a word line is selected, a bit line is not selected and in a precharged state), when it is tried to keep the bit line on the writing side at a negative potential, it may be difficult to keep the bit line on the writing side at a negative potential because of the inflow of the current from the bit line of the port in a half-selected state. Therefore, in order to keep stably the bit line on the writing side at a negative potential, it is also necessary to enlarge the grounding capacitance.

Therefore, it is understood from. Equation 1 and Equation 2 that, in order to increase the total capacitance (Call) while maintaining the potential change ΔV at the optimal point, it is only necessary to enlarge both CB and CG, keeping constant the ratio of CB to CG.

Figure 10:
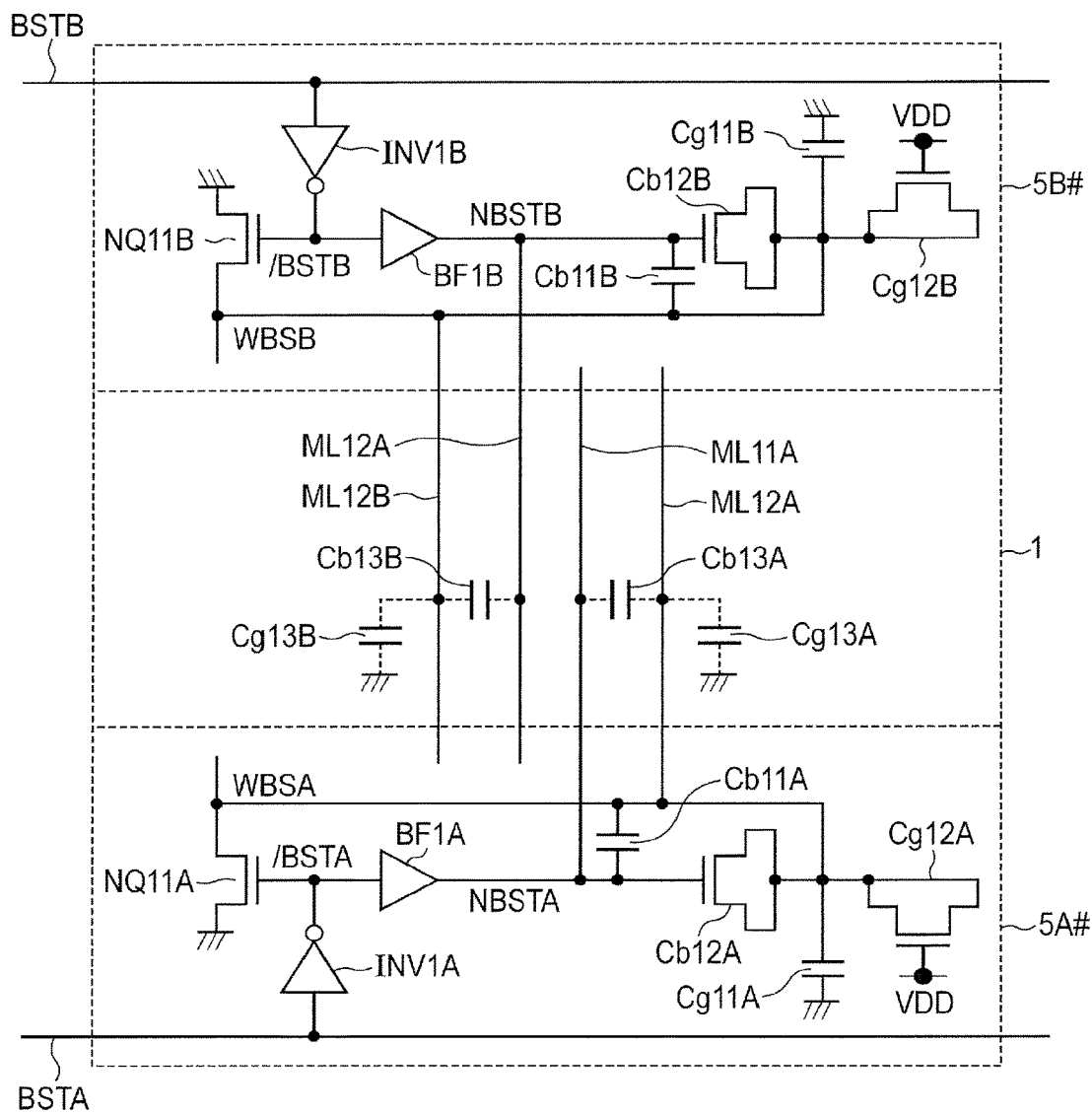
FIG. 10 is an explanatory drawing of configurations of a first write assist circuit 5A# and a second write assist circuit 5B# according to a modified example of Embodiment 1.

FIG. 10 is an explanatory drawing of configurations of a first write assist circuit 5A# and a second write assist circuit 5B# according to Modified Example of Embodiment 1.

As illustrated in FIG. 10, when compared with the configuration illustrated in FIG. 4, the first write assist circuit 5A# is different in the point that capacitive elements Cg11A and Cg12A are further added as the grounding capacitive element and capacitive elements Cb11A and Cb12A are further added as the boost capacitive element.

The capacitive elements Cb11A and Cb12A are provided between the output node NBSTA and the source node WBSA, respectively.

The capacitive element Cg11A is provided between the source node WBSA and the voltage VSS. The capacitive element Cg12A is coupled to the source node WBSA.

The capacitive element Cg12A is formed as a MOS capacitor. The source and drain of the MOS transistor are coupled to the source node WBSA, and the gate is coupled to the voltage VDD.

The capacitive element Cb12A is formed as a MOS capacitor coupled between the output node NBSTA and the source node WBSA.

According to the configuration described above, it is possible to adjust the potential change ΔV to the optimal value by keeping constant the ratio of CG to CB in Equation 1, thereby securing the necessary capacitance.

In the present embodiment, the configuration is explained in which the capacitive elements Cb11A and Cb12A are provided as the boost capacitive element. However, it is also possible to provide one capacitive element. For example, it is preferable to provide MOS capacitor elements with sufficient area efficiency as the capacitive elements Cb12A and Cg12A. Same also applies to the capacitive elements Cg11A and Cg12A.

In the present embodiment, an N-channel MOS capacitor is used as the capacitive elements Cb12A and Cg12A. However, it is also preferable to use a P-channel MOS capacitor.

The same argument is also applicable to the configuration of the second write assist circuit 5B#; therefore, the detailed explanation thereof is not repeated.

It has been assumed that the capacitive elements Cg11A, Cg12A, Cg2T, Cg2B, Cg3T, and Cg3B are grounding capacitance for the sake of explanatory convenience. However, if the potential can be fixed during the write operation, it is also preferable to adopt a configuration in which these capacitors are coupled to the power source VDD or other signal nodes.

Embodiment 2

Figure 11:
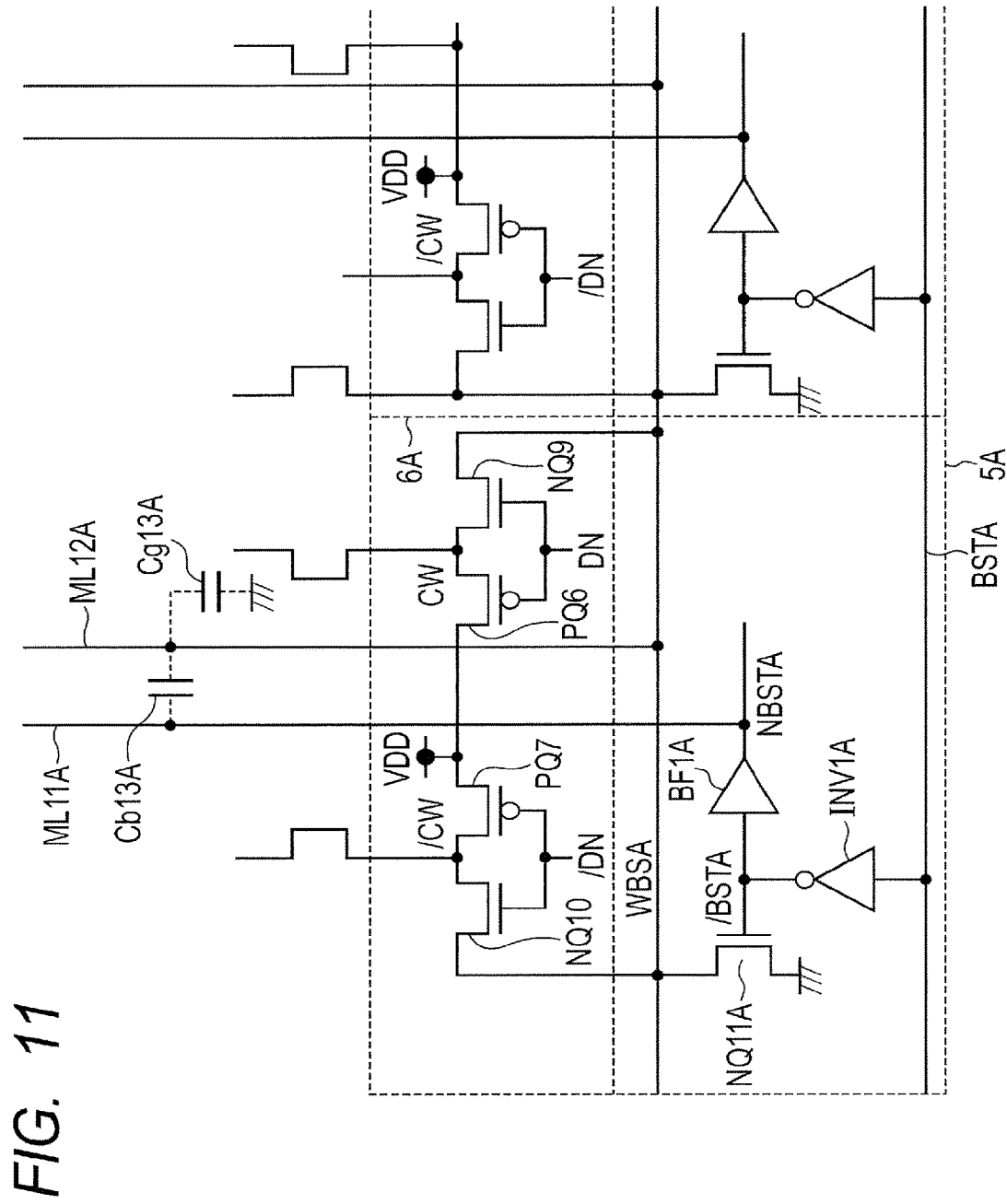
FIG. 11 is an explanatory drawing of configurations of a first write assist circuit 5A according to Embodiment 2.

FIG. 11 is an explanatory drawing of configurations of a first write assist circuit 5A according to Embodiment 2.

As illustrated in FIG. 11, plural circuits of a first write driver circuit 6A and plural circuits of a first write assist circuit 5A are provided respectively corresponding to plural columns of the memory cells. The plural circuits of the first write assist circuits 5A share a source node WBSA. FIG. 11 illustrates the case where the adjacent circuits of the first write assist circuit 5A share the source node WBSA in common. Same also applies to other write assist circuit. The second write assist circuit 5B is also provided in the same manner as in the first write assist circuit 5A.

In the disturb writing described above, when the threshold voltage of the access MOS transistor NQ5 on the disturb side becomes low, the potential rise of the bit line on the writing side becomes remarkable. However, it is rare that the threshold voltage of NQ5 of all the memory cells which perform simultaneous write varies to a low level in a similar fashion, and there exist some memory cells of which the threshold voltage varies to a high level.

Therefore, it is possible to couple the source node WBSA in common and to share the total capacity Call. Accordingly, it is possible to reinforce the writing to a transistor with a slow write operation due to the variations in transistors.

Embodiment 3

Embodiment 3 explains the method to further improve the boost capability.

Figure 12:
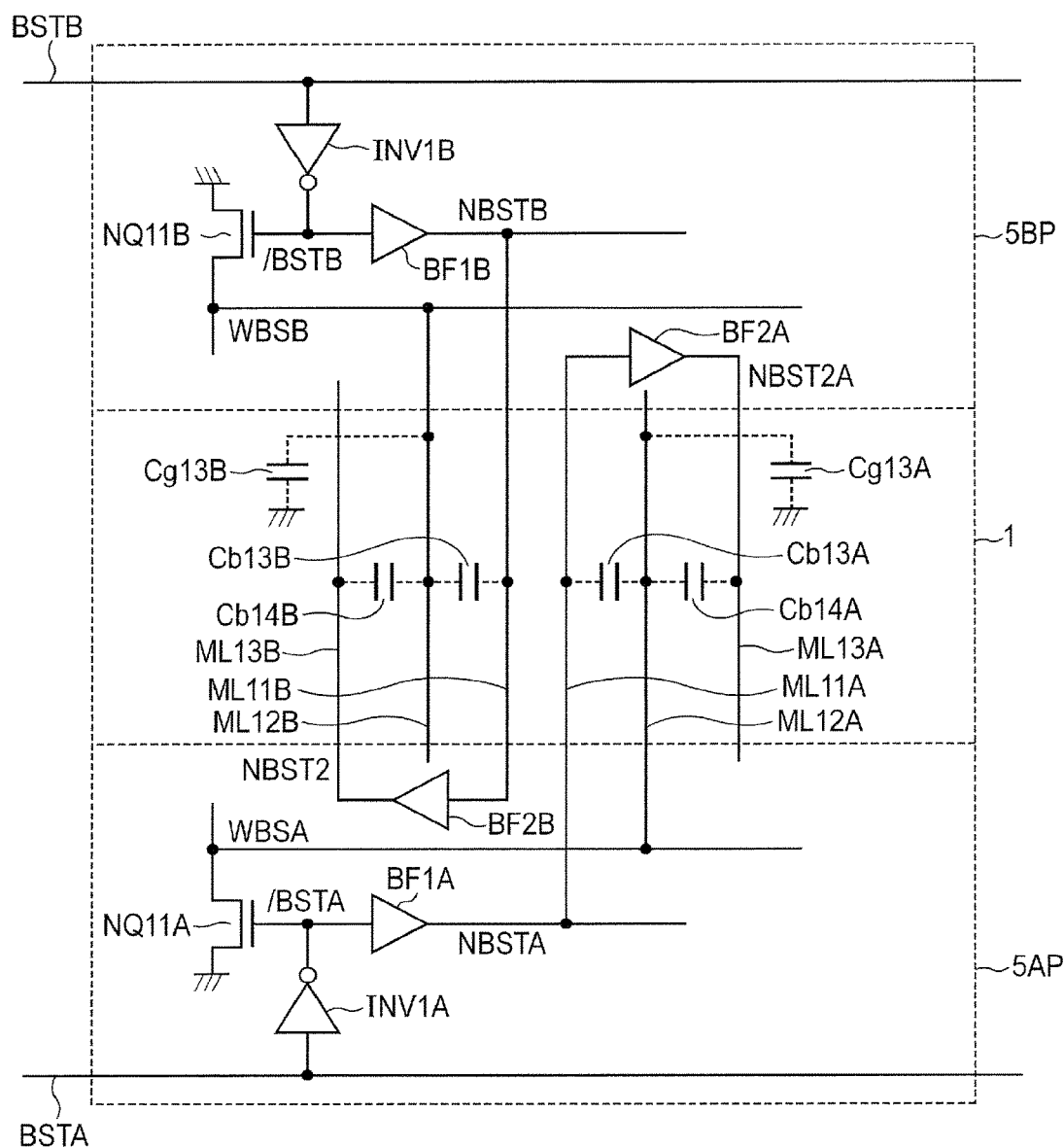
FIG. 12 is an explanatory drawing of configurations of a first write assist circuit 5AP and a second write assist circuit 5BP according to Embodiment 3.

FIG. 12 is an explanatory drawing of configurations of a first write assist circuit 5AP and a second write assist circuit 5BP according to Embodiment 3.

As illustrated in FIG. 12, the first write assist circuit 5AP differs from the first write assist circuit 5A in that a buffer BF2A and third signal wiring ML13A are added.

The buffer BF2A is coupled to the first signal wiring ML11A and drives the third signal wiring ML13A according to the signal level transferred to the first signal wiring ML11A.

Same applies also to the second write assist circuit 5BP; therefore, the detailed explanation thereof is not repeated. The output node NBSTA is coupled to the signal wiring ML11A and the node WBSA is coupled to the signal wiring ML12A. Two pieces of the signal wiring ML11A and ML12A are arranged in parallel with the bit line, and are arranged over the memory cell array 1.

A boost capacitive element Cb13A is formed based on the inter-wire coupling capacitance between the signal wiring ML11A and the signal wiring ML12A. A boost capacitive element Cb14A is formed based on the inter-wire coupling capacitance between the signal wiring ML13A and the signal wiring ML12A.

A grounding capacitance Cg13A is formed between the signal wiring ML12A and the grounding. In FIG. 12, the buffer BF2A is arranged inside the second write assist circuit 5BP; however, the place where the buffer BF2A is arranged is not specified in particular and the buffer BF2A may be arrange in any place.

Figure 13:
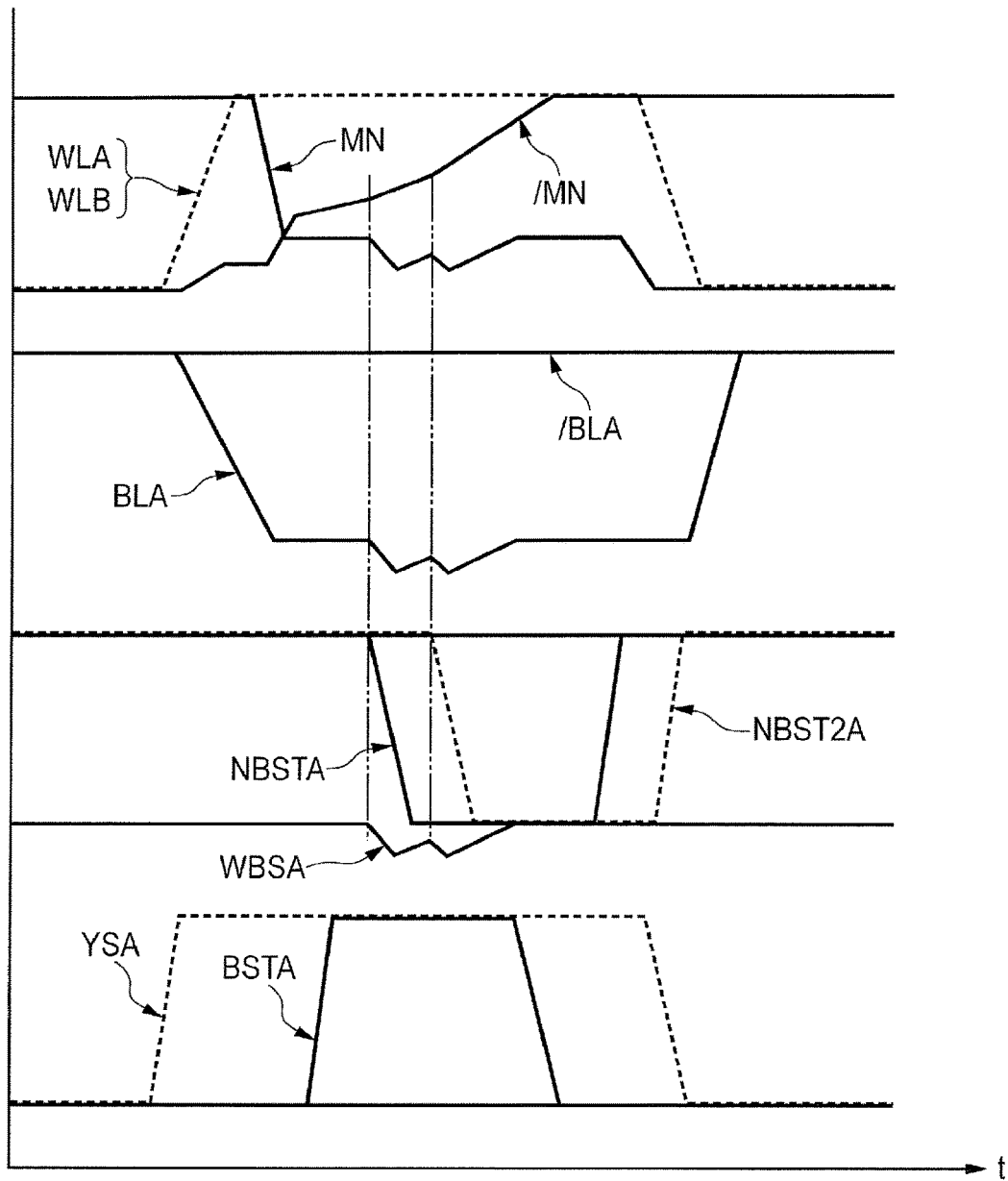
FIG. 13 is an explanatory drawing of signal waveforms in a write operation according to Embodiment 3.

FIG. 13 is an explanatory drawing of signal waveforms in a write operation according to Embodiment 3. With reference to FIG. 13, Embodiment 3 explains the case where the boost operation is performed multiple times.

The present example illustrates the case where the boost operation is performed twice. The delay time in the buffer BF2A is set shorter than the time when the potential of the bit line on the writing side goes up to about 0V due to the inflow of the current from the bit line on the disturb side.

The following explains the case where the memory node MN is reversed from an "H" level to an "L" level and the memory node /MN is reversed from an "L" level to an "H" level, using the first word line WLA and the first bit-line pair BLA and /BLA.

It is assumed that the second bit-line pair BLB and /BLB is in a precharged state. The waveforms when the second word line WLB operates to the same timing as the first word line WLA are shown as an example.

As an initial state, the first and the second word lines WLA and WLB are at an "L" level, the first column selection signal YSA is also at an "L" level, and the first bit-line pair BLA and /BLA is precharged at an "H" level by the equalizing MOS transistor PQ3 and the precharge MOS transistors PQ4 and PQ5. On the other hand, the transfer MOS transistors NQ7 and NQ8 are in a non-conductive state.

Next, an "L" level is inputted into the first write data DA. According to the first write data DA, complementary first write input data DN and /DN are at an "H" level and an "L" level, respectively, and the output nodes CW and /CW become at an "L" level and an "H" level, respectively.

Next, the first column selection signal YSA is set to an "H" level, and the equalizing MOS transistor PQ3 and the pull-up MOS transistors PQ4 and PQ5 become non-conductive. Then the transfer MOS transistors NQ7 and NQ8 become in a conductive state, the potential of the output nodes CW and /CW of the first and the second write inverter is transferred to the first bit-line pair BLA and /BLA, and the first bit line BLA is drawn out to an "L" level.

Next, the first and the second word line WLA and WLB are set to an "H" level, the potential of the first bit line BLA is transferred to the memory node MN, and the potential of the memory node MN falls.

On the other hand, the second word line WLB is also at an "H" level. Accordingly, a precharge current flows from the second bit line BLB, and the memory node MN is not set at the ground potential completely.

Therefore, the load MOS transistor PQ2 does not become in a fully conductive state, and the speed at which the memory node /MN goes up to an "H" level is reduced.

When the first boost signal BSTA is set at an "H" level, the output node /BSTA coupled to the gate of the N-channel power source MOS transistor NQ11A is set at an "L" level by the inverter INV1A. Accordingly, the N-channel power source MOS transistor NQ11A becomes non-conductive and the source node WBSA of the write inverter becomes floated.

Next, the output node NBSTA of the buffer BF1A is set at an "L" level. Accordingly, the source node WBSA of the write inverter is boosted to the negative potential based on the boost capacitive element Cb13A.

The potential of the source node WBSA pulls down the potential of the first bit line BLA via the N-channel MOS transistor NQ9 and the transfer MOS transistor NQ7 of the first write inverter.

Then, the gate-to-source voltage Vgs of the access MOS transistor NQ3 becomes large, the current driving capacity of the access MOS transistor NQ3 increases, and the potential of the memory node MN is further pulled down.

When the load MOS transistor PQ2 becomes fully conductive, the memory node /MN is pulled up to an "H" level and the reversal of the memory node is accelerated.

However, the potential of the first bit line BLA rises due to current inflow from the second bit line BLB. When the potential of the first bit line BLA changes to a positive potential, the effect of the write assist is lost, and moreover the potential reversed once can be re-reversed.

Embodiment 3 performs further re-boosting with the use of the buffer BF2A and the signal wiring ML13A.

The output node NBST2A of the buffer BF2A is set at an "L" level. Accordingly, the source node WBSA of the write inverter is further boosted to a negative potential based on the boost capacitive element Cb14A.

This accelerates reversal of the memory node again. Subsequently, it is necessary that the boost signal BSTA is returned to an "L" level to make the power source MOS transistor NQ11A conductive and to return the source node WBSA of the write inverter to the ground potential, before the potential of the first bit line BLA changes to a positive potential.

Subsequently, by returning the first word line WLA to an "L" level, the state of the memory nodes MN and /MN is reversed and stabilized.

Subsequently, by returning the first column selection signal YSA to an "L" level, the first bit-line pair BLA and /BLA is precharged, and the write operation is terminated.

When the boost capacitance CB is enlarged, the potential change ΔV of the bit line potential by the boost operation becomes large. Therefore, it is likely that an erroneous writing may take place to a memory cell coupled to the non selection word line.

According to Embodiment 3, by dividing the boost operation into multiple times, it is possible to make the potential change ΔV per time small. Accordingly, it is possible to prevent the erroneous writing such as described above.

In Embodiment 3, the configuration of the eight-transistor dual-port SRAM is explained. However, the configuration is not restricted to the one described in the present embodiment in particular, but same applies also to the so-called six-transistor single-port SRAM.

As described above, the invention accomplished by the present inventors has been concretely explained based on the embodiments. However, it cannot be overemphasized that the present invention is not restricted to the embodiments as described above, and it can be changed variously in the range which does not deviate from the gist.

What is claimed is:

1. A semiconductor device comprising:
    a word line;
    a pair of bit lines;
    a static type memory cell coupled to the word line and the pair of bit lines;
    a write driver circuit which transmits data to the pair of bit lines according to write data; and
    a write assist circuit which drives one of the pair of bit lines to a level of a negative voltage, the one of the pair of bit lines corresponding to a low potential side of the pair of bit lines according to the write data,
    wherein the write assist circuit comprises:
        a first signal wiring; and
        a second signal wiring coupled to the bit line on the low potential side and operable to generate the negative voltage based on a first coupling capacitance between the first signal wiring and the second signal wiring, and
    wherein the bit line on the low potential side is a wiring different from the second signal wiring.

2. The semiconductor device according to claim 1, wherein the second signal wiring is arranged next to the first signal wiring.

3. The semiconductor device according to claim 1, wherein the write assist circuit further comprises:
    a first transistor having a gate coupled to the first signal wiring, a first node coupled to the second signal wiring, and a second node coupled to a ground voltage.

4. The semiconductor device according to claim 1, wherein the word line is arranged along a first direction, and
    wherein the first and second signal wirings are arranged along a second direction different from the first direction.

5. The semiconductor device according to claim 3, wherein the first and second signal wirings are arranged in a same metallic wiring layer over a metallic wiring layer where the word line is arranged.

6. The semiconductor device according to claim 1, wherein the write assist circuit further comprises:
    a capacitive element provided between the first signal wiring and the second signal wiring such that the capacitive element is coupled to the first signal wiring and the second signal wiring.

7. The semiconductor device according to claim 6, wherein the capacitive element is formed as a MOS capacitor.

8. The semiconductor device according to claim 1, wherein the static type memory cell is coupled between a first voltage and a second voltage lower than the first voltage, and
    wherein the negative voltage is lower than the second voltage.

9. The semiconductor device according to claim 8, wherein the semiconductor device further comprises:
    a first voltage signal wiring operable to supply the first voltage; and
    a second voltage signal wiring operable to supply the second voltage, and
    wherein the first signal wiring, the second signal wiring, the first voltage signal wiring, and the second voltage signal wiring are arranged in a same metallic wiring layer.

10. The semiconductor device according to claim 9, wherein the first and second signal wirings are provided along the same direction as the first and second voltage signal wirings.

11. The semiconductor device according to claim 4, wherein the write assist circuit further comprises a third signal wiring, and
    wherein the second signal wiring is arranged between the first signal wiring and the third signal wiring, and operable to generate the negative voltage based on the first coupling capacitance and a second coupling capacitance between the second signal wiring and the third signal wiring.

12. The semiconductor device according to claim 11,
wherein the third signal wiring is arranged along the second direction, and
wherein the first, second and third signal wirings are arranged in a same metallic wiring layer.

\* \* \* \* \*